United States Patent
Park et al.

(10) Patent No.: US 11,133,458 B2
(45) Date of Patent: Sep. 28, 2021

(54) MULTI-BIT MAGNETIC MEMORY DEVICE

(71) Applicant: IUCF-HYU (Industry-University Cooperation Foundation Hanyang University), Seoul (KR)

(72) Inventors: Jea Gun Park, Seoul (KR); Jin Young Choi, Seoul (KR); Han Sol Jun, Seoul (KR); Dong Gi Lee, Seoul (KR); Kondo Kei, Seoul (KR); Jong Ung Baek, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 16/963,051

(22) PCT Filed: Jan. 4, 2019

(86) PCT No.: PCT/KR2019/000133
§ 371 (c)(1),
(2) Date: Jul. 17, 2020

(87) PCT Pub. No.: WO2019/143052
PCT Pub. Date: Jul. 25, 2019

(65) Prior Publication Data
US 2020/0350489 A1    Nov. 5, 2020

(30) Foreign Application Priority Data

Jan. 17, 2018  (KR) .................. 10-2018-0006143
Sep. 27, 2018  (KR) .................. 10-2018-0114960

(51) Int. Cl.
*H01L 43/02*  (2006.01)
*H01L 27/22*  (2006.01)
*H01L 43/10*  (2006.01)

(52) U.S. Cl.
CPC ............ *H01L 43/02* (2013.01); *H01L 27/226* (2013.01); *H01L 43/10* (2013.01)

(58) Field of Classification Search
CPC ........ H01L 43/02; H01L 27/226; H01L 43/10
(Continued)

(56) References Cited

U.S. PATENT DOCUMENTS 6,185,079 B1 * 2/2001 Gill ...................... G11B 5/3967
                                                       360/324.2
6,593,608 B1   7/2003 Sharma et al.
(Continued)

FOREIGN PATENT DOCUMENTS

KR   10-1737130 B1    5/2017
WO   2016/209257 A1  12/2016

OTHER PUBLICATIONS

Office Action dated Dec. 31, 2019 received in the Korean Patent Office in corresponding Korean Application No. 10-2018-0114960.
(Continued)

*Primary Examiner* — Jami Valentine Miller
(74) *Attorney, Agent, or Firm* — Sughrue Mion, PLLC

(57) ABSTRACT

Disclosed is a memory device. A memory device according to an embodiment of the present invention includes a memory device including a substrate; and a lower electrode, seed layer, lower synthetic antiferromagnetic layer, magnetic tunnel junction, upper synthetic antiferromagnetic layer, and upper electrode that are laminated on the substrate, wherein the magnetic tunnel junction includes a lower pinned layer, lower tunnel barrier layer, lower free layer, separation layer, upper free layer, upper tunnel barrier layer and upper pinned layer that are sequentially laminated.

11 Claims, 12 Drawing Sheets

(58) Field of Classification Search
USPC .......................................................... 257/421
See application file for complete search history.

(56) References Cited

U.S. PATENT DOCUMENTS

| | | | |
|---|---|---|---|
| 10,522,746 B1* | 12/2019 | Sundar | G11C 11/161 |
| 2004/0017639 A1* | 1/2004 | Deak | H01L 43/08 |
| | | | 360/324.2 |
| 2005/0167657 A1* | 8/2005 | Nickel | G11C 11/5607 |
| | | | 257/30 |
| 2011/0102948 A1* | 5/2011 | Apalkov | G11C 11/1659 |
| | | | 360/324.2 |
| 2012/0155164 A1* | 6/2012 | Shukh | G11C 11/161 |
| | | | 365/171 |
| 2014/0070341 A1 | 3/2014 | Beach et al. | |
| 2014/0103470 A1* | 4/2014 | Shukh | G11C 11/5607 |
| | | | 257/421 |
| 2014/0327095 A1* | 11/2014 | Kim | H01L 43/08 |
| | | | 257/421 |
| 2015/0171316 A1 | 6/2015 | Park et al. | |
| 2015/0340600 A1* | 11/2015 | Kim | H01L 27/228 |
| | | | 257/421 |
| 2019/0043548 A1* | 2/2019 | Park | H01L 43/10 |
| 2019/0172997 A1* | 6/2019 | Park | H01L 43/12 |
| 2021/0013260 A1* | 1/2021 | Liu | H01L 43/12 |

OTHER PUBLICATIONS

International Search Report for PCT/KR2019/000133 dated, Apr. 1, 2019 (PCT/ISA/210).

* cited by examiner

【FIG. 1】
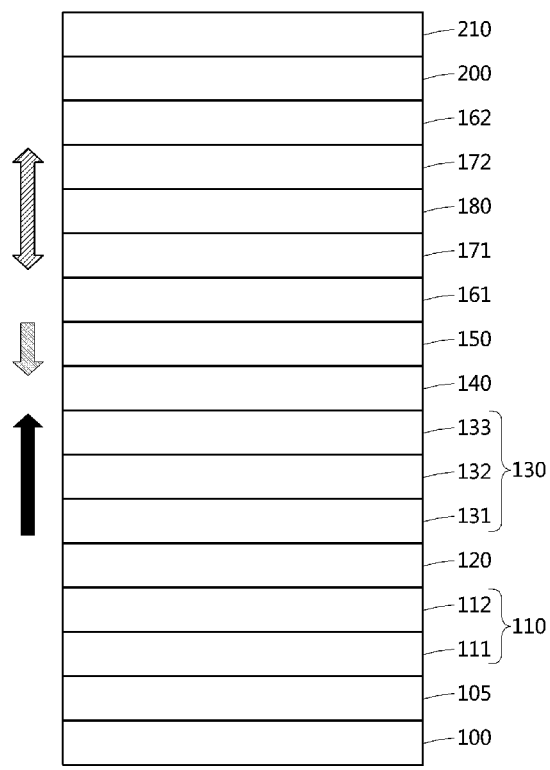
【FIG. 2A】
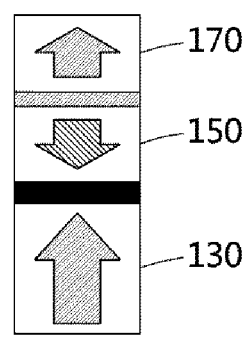

[FIG. 2B]
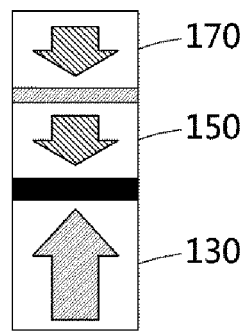
[FIG. 3]
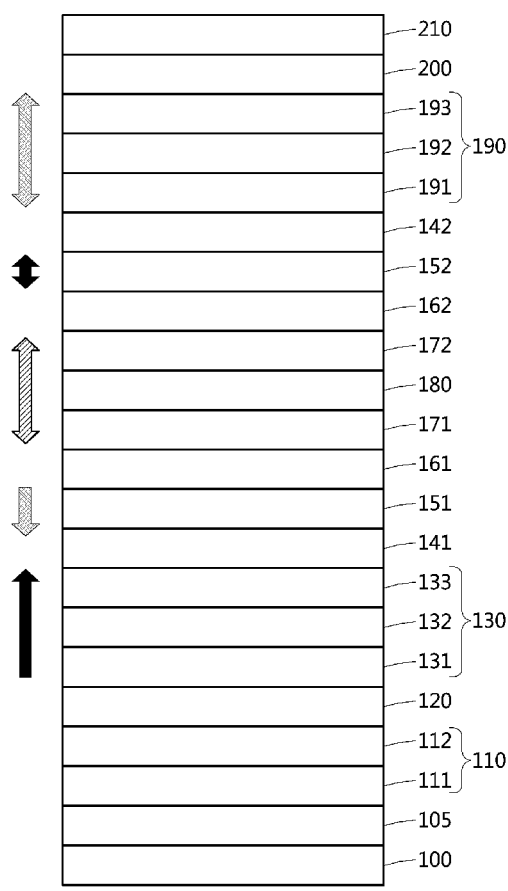

【FIG. 4A】
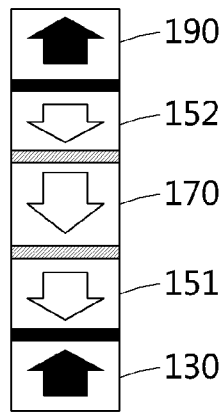
【FIG. 4B】
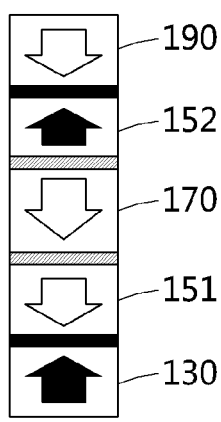
【FIG. 4C】
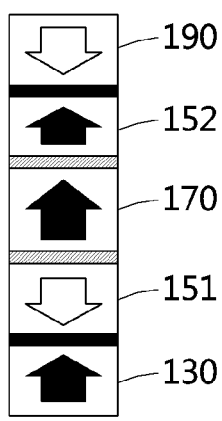

[FIG. 4D]
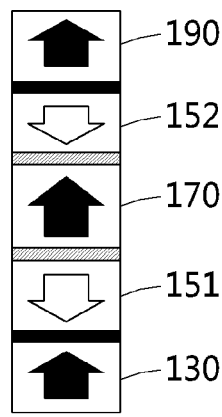
[FIG. 5A]
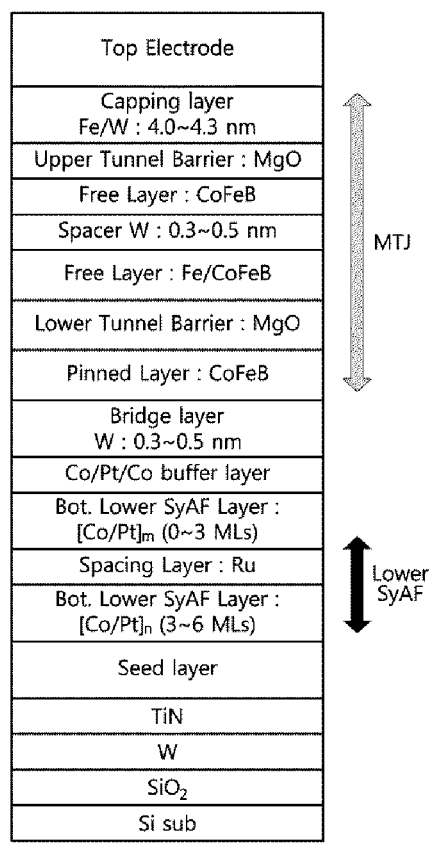

【FIG. 5B】
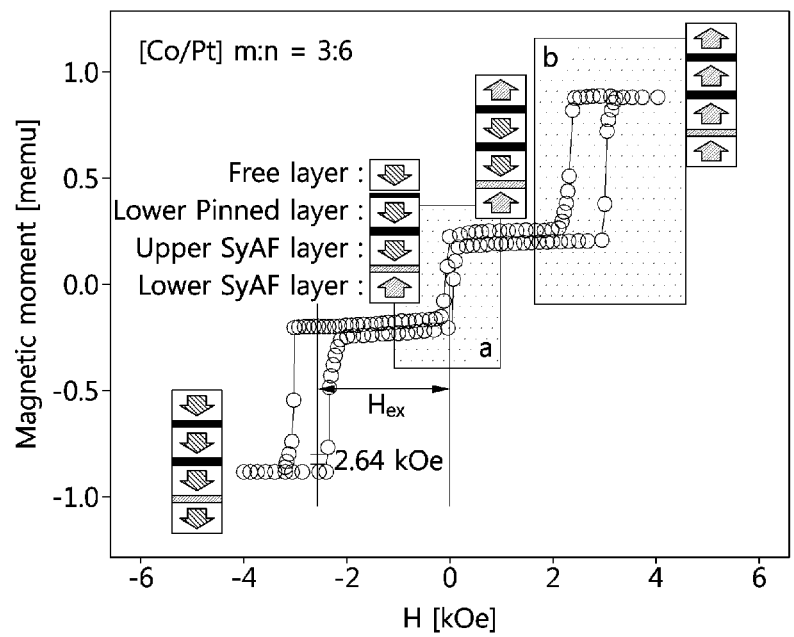
【FIG. 5C】
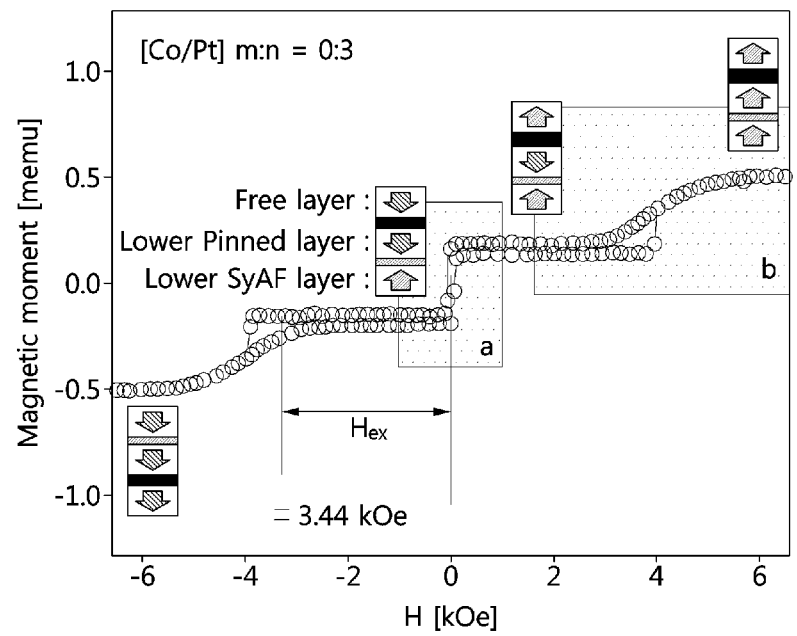

[FIG. 6A]
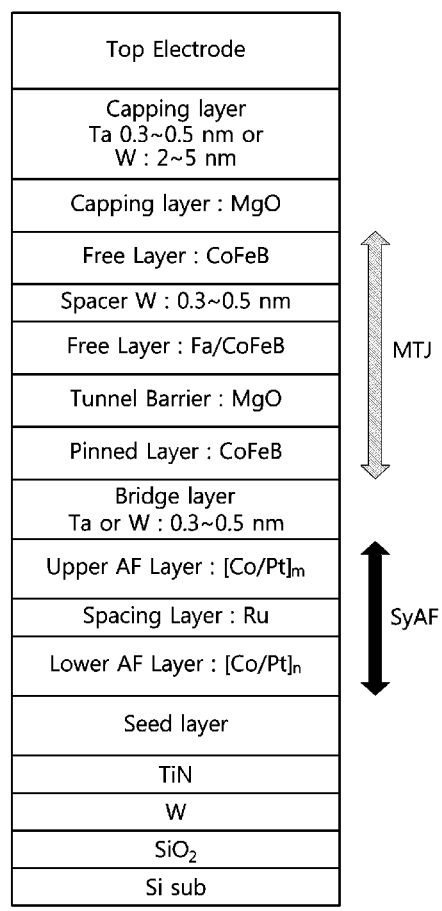

【FIG. 6B】
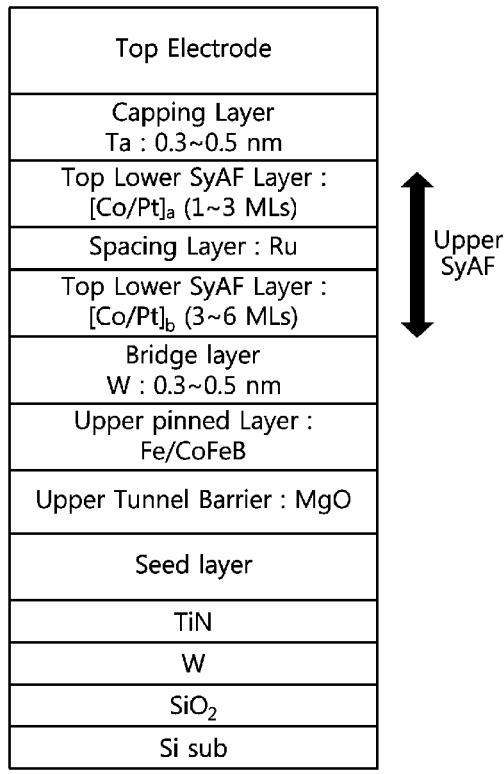
【FIG. 6C】
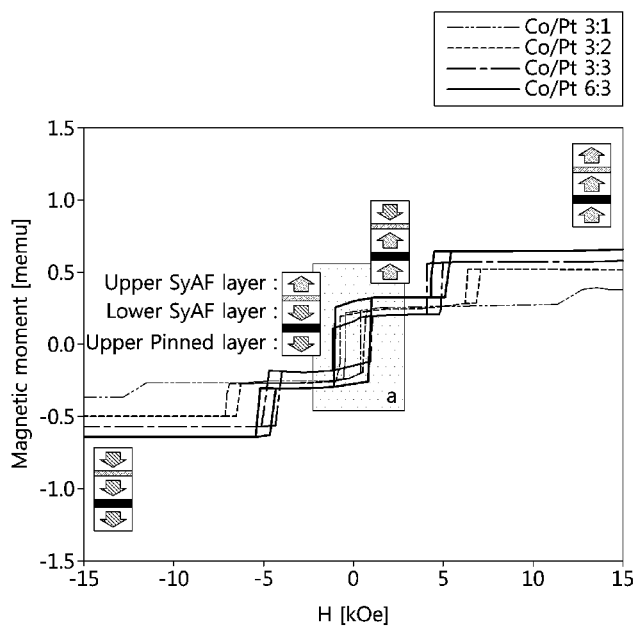

[FIG. 6D]
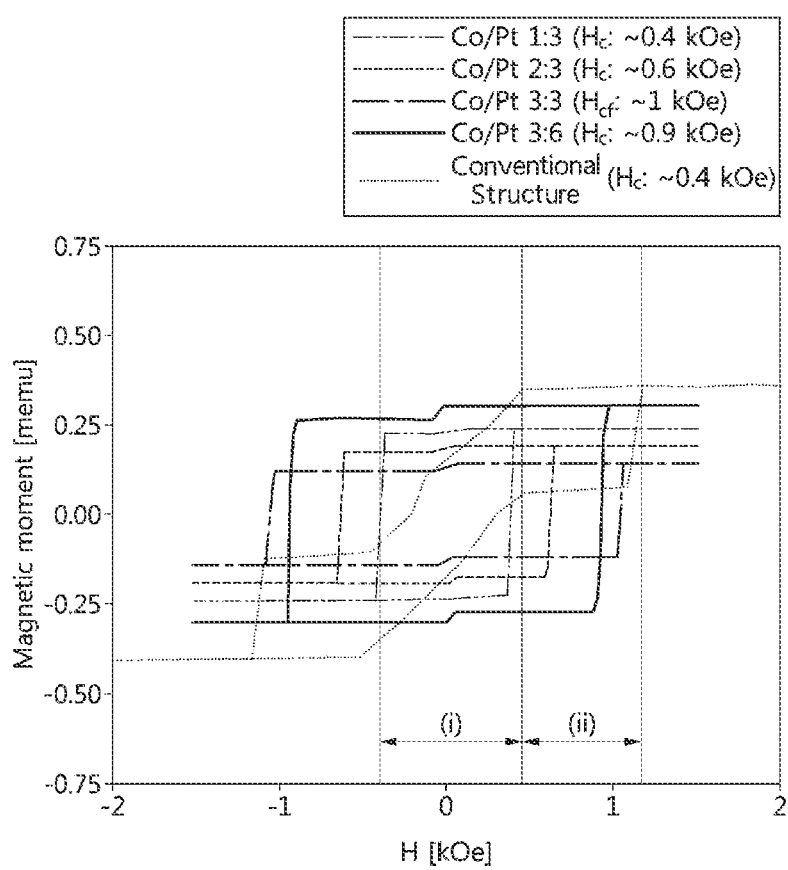

[FIG. 7A]
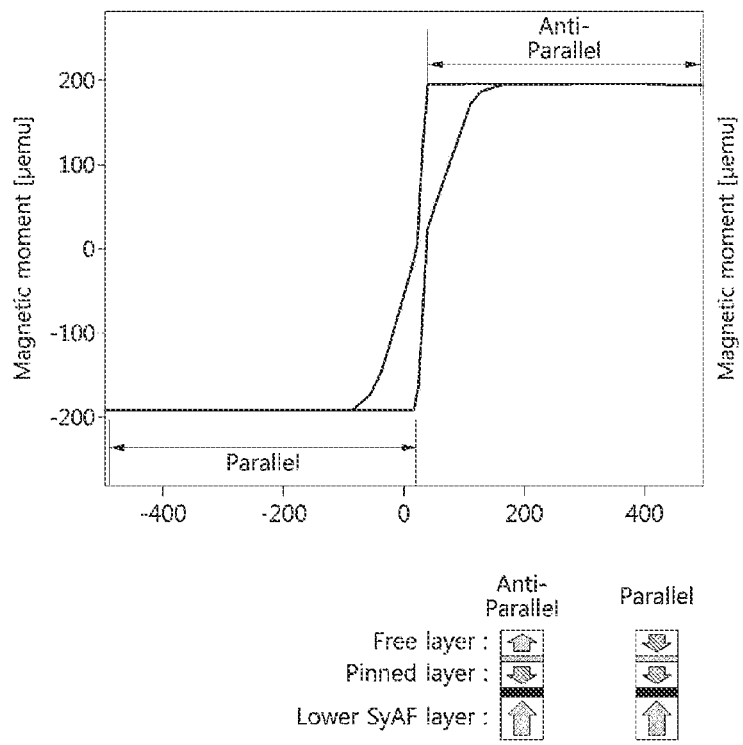
[FIG. 7B]
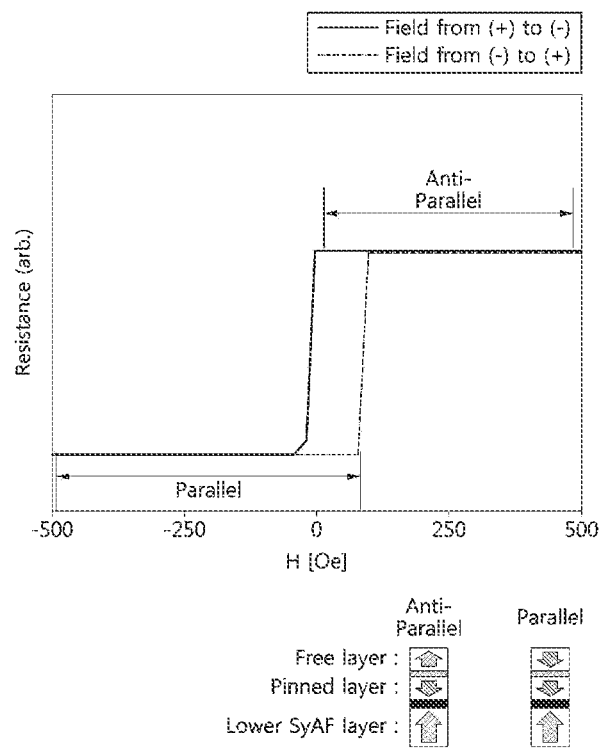

[FIG. 8A]
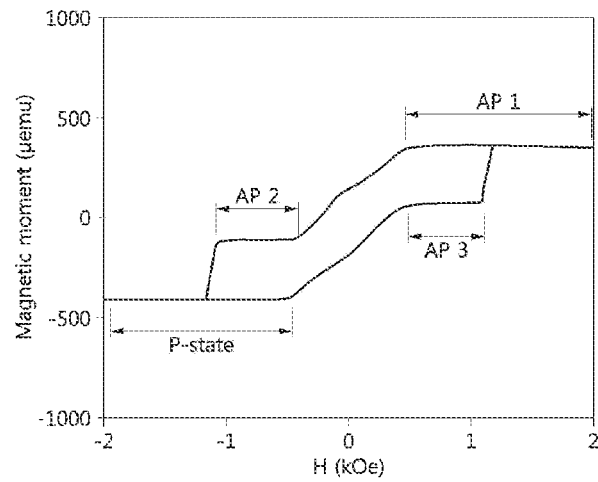
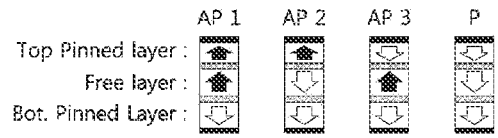
[FIG. 8B]
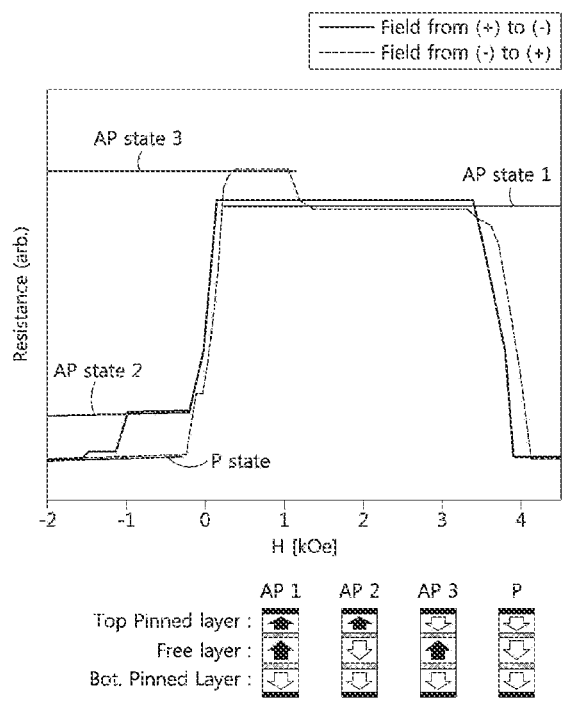

[FIG. 8C]
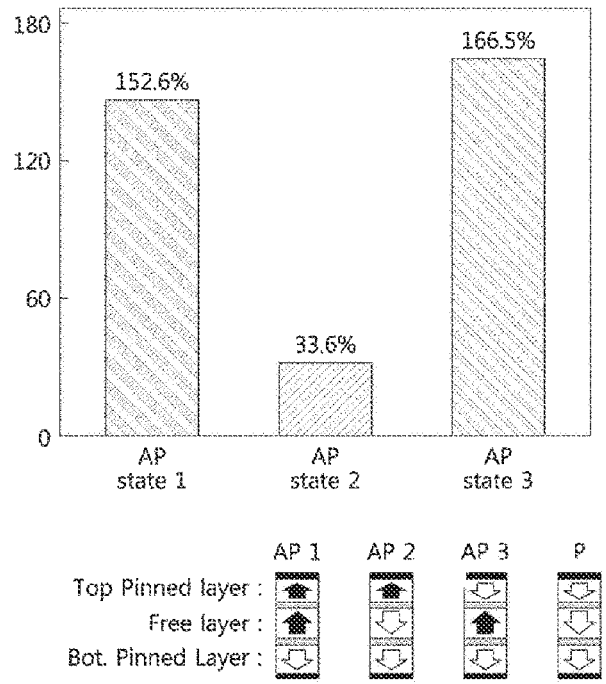
[FIG. 9]
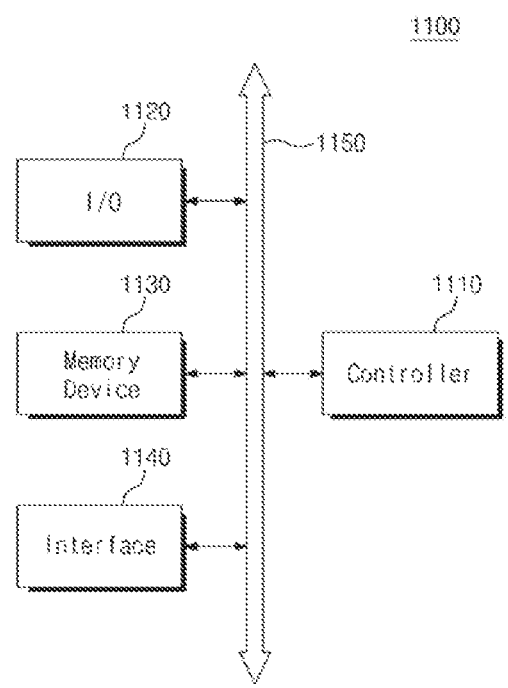

【FIG. 10】
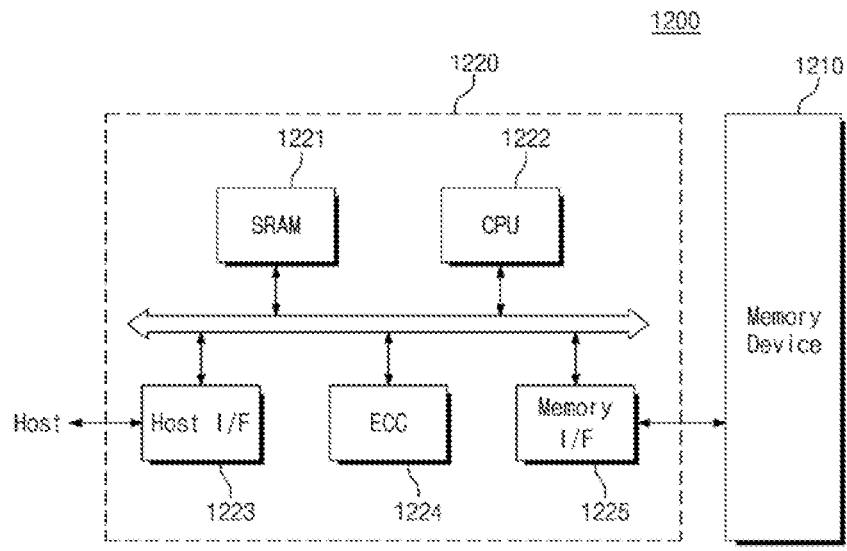
【FIG. 11】
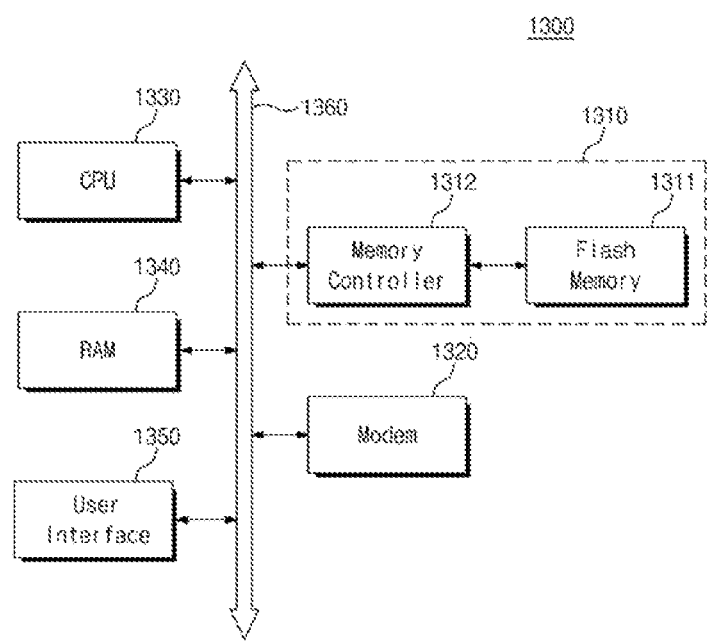

MULTI-BIT MAGNETIC MEMORY DEVICE

CROSS REFERENCE TO RELATED APPLICATIONS

This application is a National Stage of International Application No. PCT/KR2019/000133 filed Jan. 4, 2019, claiming priority based on Korean Patent Application No. 10-2018-0006143 filed Jan. 17, 2018 and Korean Patent Application No. 10-2018-0114960 filed Sep. 27, 2018.

TECHNICAL FIELD

The present invention relates to a memory device, and more particularly to a magnetic memory device that includes a magnetic tunnel junction (MTJ) including two pinned layers.

BACKGROUND ART

Next-generation non-volatile memory devices with lower power consumption and higher degree of integration than flash memory devices are being studied. Such next-generation non-volatile memory devices include phase-change random access memory (PRAM) that uses state changes of a phase change material such as chalcogenide alloys, magnetic random access memory (MRAM) that uses resistance changes in a magnetic tunnel junction (MTJ) depending on the magnetization state of a ferromagnetic material, ferroelectric random access memory (FRAM) that uses polarization of a ferroelectric material, resistance-change random access memory (ReRAM) that uses resistance changes in a variable resistance material, and the like.

Examples of MRAM include a spin-transfer torque magnetic random access memory (STT-MRAM) device that inverts magnetization using a spin-transfer torque (STT) phenomenon generated by electron injection and discriminates a resistance difference before and after magnetization inversion. The STT-MRAM device includes a magnetic tunnel junction, which consists of a pinned layer and a free layer, each formed of a ferromagnetic material, and a tunnel barrier disposed therebetween.

In the magnetic tunnel junction, when the magnetization directions of the free layer and the pinned layer are the same (that is, parallel), current flow is easy and consequently the magnetic tunnel junction is in a low resistance state. On the other hand, when the magnetization directions are different (that is, anti-parallel), current is reduced and consequently the magnetic tunnel junction is in a high resistance state. In addition, in the magnetic tunnel junction, the magnetization directions must change only to the direction perpendicular to a substrate. Accordingly, the free layer and the pinned layer must have perpendicular magnetization values.

When the perpendicular magnetization values are symmetrical with respect to 0 according to the intensity and direction of a magnetic field, and a squareness (S) shape becomes clear (S=1), perpendicular magnetic anisotropy (PMA) is considered to be excellent. The STT-MRAM device is theoretically capable of more than $10^{15}$ cycles and can be switched at a high speed of about a few nanoseconds (ns).

In particular, a perpendicular magnetization-type STT-MRAM device is advantageous in that there is no theoretical scaling limit, and as scaling progresses, the current density of driving current may be lowered. Accordingly, the perpendicular magnetization type STT-MRAM device has been actively studied as a next-generation memory device that may replace DRAM devices. An example of the STT-MRAM device is disclosed in Korean Patent No. 10-1040163.

In the STT-MRAM device, a seed layer is formed on the lower part of the free layer, a capping layer is formed on the upper part of the pinned layer, and a synthetic antiferromagnetic layer and an upper electrode are formed on the upper part of the capping layer. In addition, in the STT-MRAM device, a silicon oxide film is formed on a silicon substrate, and then the seed layer and a magnetic tunnel junction are formed thereon. In addition, a selection element such as a transistor may be formed on the silicon substrate, and the silicon oxide film may be formed so as to cover the selection element.

Accordingly, the STT-MRAM device has a laminated structure in which a silicon oxide film, a seed layer, a free layer, a tunnel barrier, a pinned layer, a capping layer, a synthetic antiferromagnetic layer, and an upper electrode are laminated on a silicon substrate on which a selection element is formed. In this case, the seed layer and the capping layer are formed using tantalum (Ta), and the synthetic antiferromagnetic layer has a structure in which a lower magnetic layer and an upper magnetic layer, in which a magnetic metal and a non-magnetic metal are alternately laminated, are formed, and a non-magnetic layer is formed therebetween.

However, currently reported magnetic tunnel junctions are based on a $SiO_2$ or MgO substrate and exclude a lower electrode or include a Ta/Ru lower electrode. By the way, to implement an STT-MRAM device, a capacitor having a 1T1C structure of existing DRAM should be replaced with a magnetic tunnel junction. Here, a lower electrode should be made of a material for reducing resistance of a transistor and preventing diffusion of metal. However, it is difficult to directly apply a magnetic tunnel junction, manufactured using an existing $SiO_2$ or MgO substrate, to memory fabrication when considering graft onto an actual cell transistor.

In addition, switching energy should be low enough to replace DRAM so as to implement an STT-MRAM device, but there are difficulties in fabricating memory due to high spin rotation energy of a free layer.

Further, there are still problems in that high programming current through STT-MRAM cells causes high current density through a magnetic layer to increase energy consumption of cells and thermal profile of layers, thereby affecting integrity and reliability of cells. In addition, when current density through a magnetic layer is high, a silicon area of each cell may increase.

Accordingly, to realize a highly integrated p-STT MRAM, MTJ cell size should be scaled down to 10 nm. However, thermal stability decreases as a cell size decreases, thereby reducing the reliability of input storage information.

DISCLOSURE

Technical Problem

Therefore, the present invention has been made in view of the above problems, and it is one object of the present invention to provide a memory device that includes a magnetic tunnel junction including lower and upper pinned layers, and thus, is capable of performing a multi-bit operation due to a resistance state increased according to a magnetization direction of the upper pinned layer.

It is another object of the present invention to provide a memory device that is capable of rapidly changing a magnetization direction of a magnetic tunnel junction therein, and thus, is capable of increasing an operation speed.

It is yet another object of the present invention to provide a memory device that includes a perpendicular magnetic tunnel junction, and thus, is capable of performing high-speed rewrite.

Technical Solution

In accordance with an aspect of the present invention, the above and other objects can be accomplished by the provision of a memory device, including: a substrate; and a lower electrode, seed layer, lower synthetic antiferromagnetic layer, magnetic tunnel junction, upper synthetic antiferromagnetic layer, and upper electrode that are laminated on the substrate, wherein the magnetic tunnel junction includes a lower pinned layer, lower tunnel barrier layer, lower free layer, separation layer, upper free layer, upper tunnel barrier layer and upper pinned layer that are sequentially laminated.

A magnetization direction of the lower pinned layer may be fixed, and a magnetization direction of the upper pinned layer may be changeable.

A magnetization direction of the lower synthetic antiferromagnetic layer may be fixed, and a magnetization direction of the upper synthetic antiferromagnetic layer may be changeable.

The upper and lower synthetic antiferromagnetic layers may be formed in a structure wherein a first magnetic layer, a non-magnetic layer and a second magnetic layer are laminated, the first and second magnetic layers including [Co/Pt].

The number of [Co/Pt] layers of the first magnetic layer of the lower synthetic antiferromagnetic layer may be 3 to 6, and the number of [Co/Pt] layers of the second magnetic layer may be 0 to 3.

The number of [Co/Pt] layers of the first magnetic layer of the upper synthetic antiferromagnetic layer may be 3 to 6, and the number of [Co/Pt] layers of the second magnetic layer may be 1 to 3.

The lower electrode may have a structure wherein a first lower electrode including tungsten and a second lower electrode including TiN are laminated.

A bridge layer may be further included between the lower synthetic antiferromagnetic layer and the magnetic tunnel junction and between the magnetic tunnel junction and the upper synthetic antiferromagnetic layer.

The bridge layer may have a thickness of 0.3 nm to 0.5 nm.

A capping layer may be further included between the upper synthetic antiferromagnetic layer and the upper electrode.

The capping layer may have a thickness of 0.3 nm to 0.5 nm.

Advantageous Effects

According to an embodiment of the present invention, provided is a memory device that includes a magnetic tunnel junction including lower and upper pinned layers, and thus, is capable of performing a multi-bit operation due to a resistance state increased according to a magnetization direction of the upper pinned layer.

According to an embodiment of the present invention, provided is a memory device that is capable of rapidly changing a magnetization direction of a magnetic tunnel junction therein, and thus, is capable of increasing an operation speed.

According to an embodiment of the present invention, provided is a memory device that includes a perpendicular magnetic tunnel junction, and thus, is capable of performing high-speed rewrite.

DESCRIPTION OF DRAWINGS

FIG. 1 illustrates a sectional view of a memory device having a conventional structure.

FIGS. 2A and 2B are schematic diagrams illustrating parallel and anti-parallel states of a memory device having a conventional structure.

FIG. 3 illustrates a sectional view of a memory device according to an embodiment of the present invention.

FIGS. 4A to 4D are schematic diagrams illustrating parallel and anti-parallel states of a memory device according to an embodiment of the present invention.

FIG. 5A illustrates an embodiment of a lower pinned layer structure of a memory device according to an embodiment of the present invention.

FIGS. 5B and 5C illustrate magnetic properties dependent upon a lamination ratio of second and first magnetic layers of a lower synthetic antiferromagnetic layer in a lower pinned layer structure of a memory device according to an embodiment of the present invention.

FIG. 6A illustrates an embodiment of a memory device having a conventional structure, and FIG. 6B illustrates an embodiment of the structure of an upper pinned layer of a memory device according to an embodiment of the present invention.

FIGS. 6C and 6D illustrate magnetic properties dependent upon a lamination ratio of first and second magnetic layers of an upper synthetic antiferromagnetic layer in an upper pinned layer structure of a memory device according to an embodiment of the present invention.

FIGS. 7A and 7B illustrate magnetic properties of a memory device including a single pinned layer.

FIGS. 8A and 8B illustrate magnetic properties of a memory device according to an embodiment of the present invention.

FIG. 8C illustrates tunnel magnetic resistance (TMR) ratios dependent upon anti-parallel states (AP1 to AP3) of a memory device according to an embodiment of the present invention.

FIG. 9 is a schematic block diagram illustrating an embodiment of a memory system including a memory device according to an embodiment of the present invention.

FIG. 10 is a schematic block diagram illustrating an embodiment of a memory card provided with a memory device according to an embodiment of the present invention.

FIG. 11 is a schematic block diagram illustrating an embodiment of an information processing system equipped with a memory device according to an embodiment of the present invention.

BEST MODE

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

FIG. 1 illustrates a sectional view of a memory device having a conventional structure.

A memory device having a conventional structure includes a substrate 100 and a lower electrode 110, seed layer 120, synthetic antiferromagnetic layer 130, magnetic tunnel junction and upper electrode 210 laminated on the substrate 100. The magnetic tunnel junction includes a pinned layer 150, a lower tunnel barrier layer 161, a lower free layer 171, a separation layer 180, an upper free layer 172 and a first capping layer 162 that are sequentially laminated.

However, since the memory device having a conventional structure includes the single pinned layer 150, perpendicular magnetic anisotropy, such as perpendicular magnetic properties, and resistance may be exhibited in a double free layer (information storage layer) region including the upper free layer 172, the separation layer 180 and the lower free layer 171.

In addition, in the case of the memory device having a conventional structure, a cell size of a magnetic tunnel junction should be scaled down to 10 nm so as to realize high integration. However, thermal stability decreases with decreasing cell size, so that the reliability of input storage information is decreased.

FIGS. 2A and 2B are schematic diagrams illustrating parallel and anti-parallel states of a memory device having a conventional structure.

Referring to FIGS. 2A and 2B, a magnetization direction of a single pinned layer 150 of a memory device having a conventional structure is fixed, and a magnetization direction of a double free layer 170 including an upper free layer 172, a separation layer 180 and a lower free layer 171 is changed. Accordingly, when magnetization directions of the pinned layer 150 and the double free layer 170 are parallel, a low resistance state (parallel state) is obtained. On the other hand, when magnetization directions of the pinned layer 150 and the double free layer 170 are anti-parallel, a high resistance state (anti-parallel state) is obtained.

Accordingly, two resistance states including a low resistance state and a high resistance state are present in a memory device with a conventional structure including a single pinned layer, and thus, only 1-bit operation is possible.

FIG. 3 illustrates a sectional view of a memory device according to an embodiment of the present invention.

On a substrate 100 of the memory device according to an embodiment of the present invention, a lower electrode 110, a seed layer 120, a lower synthetic antiferromagnetic layer 130, a magnetic tunnel junction, an upper synthetic antiferromagnetic layer 190 and an upper electrode 210 are laminated. The magnetic tunnel junction includes a lower pinned layer 151, lower tunnel barrier layer 161, lower free layer 171, separation layer 180, upper free layer 172, upper tunnel barrier layer 162 and upper pinned layer 152 sequentially laminated.

The substrate 100 may be a semiconductor substrate. For example, the substrate 100 may be a silicon substrate, a gallium arsenide substrate, a silicon germanium substrate, a silicon oxide film substrate, or the like. The memory device according to an embodiment of the present invention may include a silicon substrate. In addition, a selection element including a transistor may be formed on the substrate 100.

According to an embodiment, an insulating layer 105 may be formed on the substrate 100. The insulating layer 105 may be formed to cover a predetermined structure such as a selection element. A contact hole for exposing at least portion of a selection element may be formed in the insulating layer 105. The insulating layer 105 may be formed using an amorphous silicon oxide film ($SiO_2$) or the like.

The lower electrode 110 is formed on the insulating layer 105. The lower electrode 110 may be formed using a conductive material. The conductive material may be a metal, a metal nitride, or the like.

In addition, the memory device according to an embodiment of the present invention may be formed in a double structure including first and second lower electrodes 111 and 112. The first lower electrode 111 may be formed on the insulating layer 105, and the second lower electrode 112 may be formed on the first lower electrode 111. In addition, the first lower electrode 111 may be formed inside the insulating layer 105, and thus, may be connected to a selection element formed on the substrate 100.

The first and second lower electrodes 111 and 112 may be formed of a polycrystalline material. Accordingly, the first and second lower electrodes 111 and 112 may be formed of a conductive material having a body-centered cubic (BCC) structure. For example, the first lower electrode 111 may be formed of a metal such as tungsten (W), and the second lower electrode 112 may be formed of a metal nitride such as a titanium nitride (TiN) film.

Preferably, the lower electrode 110 of the memory device according to an embodiment of the present invention may have a structure wherein the first lower electrode 111 including tungsten (W) and the second lower electrode 112 including TiN are laminated.

Since the first and second lower electrodes 111 and 112 are formed of polycrystalline materials, the crystallinity of a subsequently formed magnetic tunnel junction may be improved. Accordingly, when the first and second lower electrodes 111 and 112 are included, the amorphous magnetic tunnel junction formed on the first and second lower electrodes 111 and 112 grows in the crystal direction of the first lower electrode 111. In addition, when heat treatment for perpendicular magnetic anisotropy is subsequently performed, the crystallinity of the magnetic tunnel junction may be improved as compared with conventional cases.

Accordingly, in conventional cases, crystallinity is not improved, compared to the present invention, although heat treatment is subsequently performed because an amorphous seed layer and amorphous magnetic tunnel junction are formed on an amorphous insulating layer. When the crystallinity of the magnetic tunnel junction is improved, the magnitude of magnetization generated when a magnetic field is applied may be increased, and the amount of current flowing through the magnetic tunnel junction in a parallel state may be increased. Accordingly, the operation speed and reliability of the memory device may be improved when such a magnetic tunnel junction is applied to a memory device.

The seed layer 120 is formed on the lower electrode 110. The seed layer 120 may be formed of a material allowing crystal growth of the lower synthetic antiferromagnetic layer 130. Accordingly, the seed layer 120 may allow the first and second magnetic layers 131 and 133 of the lower synthetic antiferromagnetic layer 130 to grow in a desired crystal direction. For example, the seed layer 120 may be formed of a metal that facilitates crystal growth in the (111) direction of a face-centered cubic (FCC) lattice or the (001) direction of a hexagonal close-packed (HCP) structure.

The seed layer 120 may include a metal selected from the group consisting of tantalum (Ta), ruthenium (Ru), titanium (Ti), palladium (Pd), platinum (Pt), magnesium (Mg), cobalt (Co), aluminum (Al) and tungsten (W) or alloys thereof. Preferably, the seed layer 120 may be formed of platinum (Pt) and may be formed to a thickness of 1 nm to 3 nm.

The lower synthetic antiferromagnetic layer 130 is formed on the seed layer 120. A magnetization direction of the lower synthetic antiferromagnetic layer 130 may be fixed, and the lower synthetic antiferromagnetic layer 130 serves to fix magnetization of the lower pinned layer 151.

The lower synthetic antiferromagnetic layer 130 may include a first magnetic layer 131, a non-magnetic layer 132 and a second magnetic layer 133. That is, in the lower synthetic antiferromagnetic layer 130, the first magnetic layer 131 and the second magnetic layer 133 are antiferromagnetically coupled with each other via the non-magnetic layer 132. In addition, the first magnetic layer 131 and the second magnetic layer 133 may have crystals in the (111) direction of a face-centered cubic (FCC) or the (001) direction of a hexagonal close-packed (HCP) structure.

In addition, magnetization directions of the first and second magnetic layers 131 and 133 are arranged to be anti-parallel. For example, the first magnetic layer 131 may be magnetized in an upward direction (i.e., in the direction of the upper electrode 210), and the second magnetic layer 133 may be magnetized in a downward direction (i.e., in the direction of the substrate 100).

The first magnetic layer 131 and the second magnetic layer 133 may be formed in a structure wherein a magnetic metal and a non-magnetic metal are alternately laminated. As the magnetic metal, a single metal selected from the group consisting of iron (Fe), cobalt (Co), nickel (Ni) and the like or alloys thereof may be used. As the non-magnetic metal, a single metal selected from the group consisting of chromium (Cr), platinum (Pt), palladium (Pd), iridium (Ir), rhodium (Rh), ruthenium (Ru), osmium (Os), rhenium (Re), gold (Au) and copper (Cu) or alloys thereof may be used. For example, the first magnetic layer 131 and the second magnetic layer 133 may be formed of $[Co/Pd]_X$, $[Co/Pt]_X$ or $[CoFe/Pt]_X$ (where X is an integer greater than or equal to 1), preferably $[Co/Pt]_X$ ((where X is an integer greater than or equal to 1)).

In addition, the number of [Co/Pt] layers of the first magnetic layer 131 of the lower synthetic antiferromagnetic layer 130 of the memory device according to an embodiment of the present invention may be 3 to 6, and the number of [Co/Pt] layers of the second magnetic layer 133 may be 0 to 3. Accordingly, the first magnetic layer 131 may be formed thicker than the second magnetic layer 133.

For example, the first and second magnetic layers 131 and 133 may be formed to have the same thickness by laminating the same material a plurality of times. In this case, the number of times of lamination may be larger at the time of forming the first magnetic layer 131 as compared to at the time of forming the second magnetic layer 133. For example, the first magnetic layer 131 may be formed of $[Co/Pt]_6$, that is, may be formed by laminating Co and Pt six times, and the second magnetic layer 133 may be formed of $[Co/Pt]_3$, that is, may be formed by laminating Co and Pt three times. In this case, Co may be formed in a thickness of 0.3 nm to 0.5 nm. Pt may be formed thinner than Co, or may be formed in the same thickness as Co. For example, Pt may be formed in a thickness of 0.2 nm to 0.4 nm.

In addition, Co may be further formed on the repeatedly laminated [Co/Pt], i.e., $[Co/Pt]_6$, of the first magnetic layer 131. That is, the first magnetic layer 131 may have a structure wherein Co is laminated one more time than Pt. In this case, a Co layer located at the top may be formed thicker than Co layers located therebelow, and, for example, may be formed to have a thickness of 0.5 nm to 0.7 nm. In addition, Co and Pt may be further formed under $[Co/Pt]_3$ of the second magnetic layer 133, and Co may be further formed on the second magnetic layer 133. That is, Co, Pt, $[Co/Pt]_3$ and Co may be laminated on the non-magnetic layer 132, thereby forming the second magnetic layer 133. Here, Co under $[Co/Pt]_3$ has the same or thicker thickness than Co of $[Co/Pt]_3$. For example, Co under $[Co/Pt]_3$ may be formed to a thickness of 0.5 nm to 0.7 nm, Pt under [Co/Pt]$_3$ may be formed to the same thickness as Pt of [Co/Pt]$_3$, and Co on [Co/Pt]$_3$ may be formed to the same thickness as that of Co of [Co/Pt]$_3$.

The non-magnetic layer 132 is formed between the first magnetic layer 131 and the second magnetic layer 133, and may be formed of a non-magnetic material to allow antimagnetic coupling of the first magnetic layer 131 and the second magnetic layer 133. For example, the non-magnetic layer 132 may be formed of a single material selected from the group consisting of ruthenium (Ru), rhodium (Rh), osmium (Os), rhenium (Re) and chromium (Cr) or alloys thereof, preferably ruthenium (Ru).

According to an embodiment, a first bridge layer 141 may be further included between the lower synthetic antiferromagnetic layer 130 and the magnetic tunnel junction of the memory device according to an embodiment of the present invention.

The first bridge layer 141 is formed on the lower synthetic antiferromagnetic layer 130. Due to the formation of the first bridge layer 141, magnetization of the lower synthetic antiferromagnetic layer 130 and the lower pinned layer 151 may be generated independently from each other. In addition, the first bridge layer 141 may be formed of a material for improving the crystallinity of a magnetic tunnel junction. Accordingly, the first bridge layer 141 may be formed of a polycrystalline material, e.g., a conductive material having a body-centered cubic (BCC) structure, preferably tungsten (W). The first bridge layer 141 may be formed of a polycrystalline material, thereby improving the crystallinity of the magnetic tunnel junction formed thereon.

When the polycrystalline first bridge layer 141 is formed, the amorphous magnetic tunnel junction formed on the polycrystalline first bridge layer 141 grows in the crystal direction of the first bridge layer 141. Subsequently, when heat treatment for perpendicular magnetic anisotropy is performed, the crystallinity of the magnetic tunnel junction may be improved as compared with conventional cases. In particular, when the first bridge layer 141 is formed using W, crystallization occurs after high-temperature heat treatment at 400° C. or higher, e.g., 400° C. to 500° C. so that diffusion of a heterogeneous material into lower and upper tunnel barriers 161 and 162 may be suppressed. Further, the lower and upper pinned layers 151 and 152 and the lower and upper free layers 171 and 172 may be crystallized, thereby maintaining perpendicular magnetic anisotropy of the magnetic tunnel junction. That is, when the crystallinity of the magnetic tunnel junction is improved, the magnitude of magnetization generated when a magnetic field is applied may be increased, and the amount of current flowing through the magnetic tunnel junction in a parallel state may be increased.

Accordingly, when the magnetic tunnel junction for a memory device according to an embodiment of the present invention is applied to a memory device, an operation speed and reliability of the memory device may be improved. Meanwhile, the first bridge layer 141 may be formed to a thickness of, for example, 0.3 nm to 0.5 nm.

A magnetization direction of the lower pinned layer 151 is fixed when the second magnetic layer 133 of the lower synthetic antiferromagnetic layer 130 and the lower pinned layer 151 are ferrocoupled. However, when the first bridge layer 141 is formed to a thickness of 0.5 nm using W, the lower pinned layer 151 has the same magnetization direction as the lower and upper free layers 171 and 172 without fixation of the magnetization direction of the lower pinned layer 151 due to the increased thickness of the first bridge layer 141, so that the same magnetization direction and different magnetization directions necessary in an MRAM device do not occur and thus the device does not operate as a memory.

The magnetic tunnel junction is formed on the first bridge layer 141, and the magnetic tunnel junction includes the lower pinned layer 151, lower tunnel barrier layer 161, lower free layer 171, separation layer 180, upper free layer 172, upper tunnel barrier layer 162 and upper pinned layer 152 that are sequentially laminated.

Accordingly, the memory device according to an embodiment of the present invention may include a double pinned layer 150 including the lower pinned layer 151 and the upper pinned layer 152; a double tunnel barrier layer 160 including the lower tunnel barrier layer 161 and the upper tunnel barrier layer 162; and a double free layer 170 including the lower free layer 171, the separation layer 180 and the upper free layer 172.

In addition, a magnetization direction of the lower pinned layer 151 may be fixed, and magnetization of the upper pinned layer 152 may be changed from one direction to an opposite direction thereto without being fixed to one direction. For example, magnetization of the lower pinned layer 151 may be fixed in a direction from the top to the bottom, and magnetization of the upper pinned layer 152 may be changed in a direction from the top from the bottom. Accordingly, since four resistance states may be maintained according to a magnetization direction of the upper pinned layer 152 and a magnetization direction of the double free layer 170, a multi-bit operation is possible and thus high integration may be easily realized.

More specifically, a pinned layer is not generally affected by an operation applied to change a free layer and serves to maintain magnetic properties. A 2-bit MRAM memory cell includes the pinned layer, and thus, may be operated only by changing a free layer. However, a magnetization direction of the pinned layer may be changed when energy required for switching is applied to the device.

Accordingly, since a magnetization direction of the upper pinned layer 152 of the memory device according to an embodiment of the present invention is not changed when a magnetization direction of the double free layer 170 is switched, the upper pinned layer 152 may be used as a pinned layer.

In addition, in the case of the memory device according to an embodiment of the present invention, a coercivity value of the upper pinned layer 152 used to change a magnetization direction of the upper pinned layer 152 is 1 kOe that is smaller than an exchange field (Hex) value (>2 kOe) of a generally used pinned layer. Accordingly, four resistance states may be maintained according to a magnetization direction of the upper pinned layer 152 and a magnetization direction of the double free layer 170, so that a multi-bit operation is possible.

The lower pinned layer 151 and the upper pinned layer 152 may be formed of ferromagnetic materials. The lower pinned layer 151 and the upper pinned layer 152 may be formed, for example, using a half-metallic full Heusler alloy, an amorphous rare earth element alloy, a multilayer thin film wherein a magnetic metal and non-magnetic metal are alternately laminated, an alloy having an L10-type crystal structure, or a ferromagnetic material such as a cobalt-based alloy.

An example of the half-metallic full Heusler alloy includes CoFeAl, CoFeAlSi, and the like, and an example of the amorphous rare earth element alloy includes alloys such as TbFe, TbCo, TbFeCo, DyTbFeCo, GdTbCo, and the like.

In addition, an example of the multilayer thin film wherein a non-magnetic metal and a magnetic metal are alternately laminated includes [Co/Pt], Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, an example of the alloy having an L10-type crystal structure includes $Fe_{50}Pt_{50}$, $Fe_{50}Pd_{50}$, $Co_{50}Pt_{50}$, $Fe_{30}Ni_{20}Pt_{50}$, $Co_{30}Ni_{20}Pt_{50}$, and the like. In addition, an example of the cobalt-based alloy includes CoCr, CoPt, CoCrPt, CoCrTa, CoCrPtTa, CoCrNb, CoFeB, and the like. Thereamong, a CoFeB monolayer may be formed thicker than multilayer structures such as CoFeB and [Co/Pt] or Co/Pd, thereby increasing a magnetic resistance ratio.

In addition, since CoFeB is easily etched compared to metals such as Pt and Pd, a CoFeB monolayer may be easily manufactured compared to a multilayer structure containing Pt, Pd, or the like. In addition, horizontal magnetization as well as perpendicular magnetization may be provided by adjusting the thickness of CoFeB. Accordingly, the lower and upper pinned layers 151 and 152 of the memory device according to an embodiment of the present invention are formed using a CoFeB monolayer. The CoFeB monolayer is formed in an amorphous state, and then textured to have a BCC structure 100 by heat treatment. Meanwhile, the lower pinned layer 151 and the upper pinned layer 152 may be formed to a thickness of, for example, 0.5 nm to 1.5 nm.

The lower tunnel barrier layer 161 separates the lower pinned layer 151 from the lower free layer 171 and allows quantum mechanical tunneling between the lower pinned layer 151 and the lower free layer 171. The upper tunnel barrier layer 162 separates the upper pinned layer 152 from the upper free layer 172 and allows quantum mechanical tunneling between the upper pinned layer 152 and the upper free layer 172.

The lower tunnel barrier layer 161 and the upper tunnel barrier layer 162 may be formed of magnesium oxide (MgO), aluminum oxide ($Al_2O_3$), silicon oxide ($SiO_2$), tantalum oxide ($Ta_2O_5$), silicon nitride ($SiN_X$), aluminum nitride ($AlN_X$), or the like. The lower and upper tunnel barrier layers 161 and 162 of the memory device according to an embodiment of the present invention may be formed using a polycrystalline magnesium oxide. The magnesium oxide is textured to the BCC structure 100 by subsequent heat treatment. Meanwhile, the lower and upper tunnel barrier layers 161 and 162 may be formed to be the same or thicker than the lower and upper pinned layers 151 and 152, for example may be formed to a thickness of 0.5 nm to 1.5 nm.

The double free layer 180 is formed on the lower tunnel barrier layer 161 to be formed between the lower tunnel barrier layer 161 and the upper tunnel barrier layer 162. Magnetization of the double free layer 180 may be changed from one direction to a direction opposite thereto without being fixed to one direction. A magnetization direction of the double free layer 180 may be the same (i.e., parallel) or opposite (i.e., anti-parallel) to that of the lower pinned layer 151.

A resistance value of the magnetic tunnel junction is changed according to magnetization arrangement of the double free layer 180 to the lower pinned layer 151 and the upper pinned layer 152, so that the magnetic tunnel junction may be applied to a memory device. For example, a resistance value of the magnetic tunnel junction is decreased when a magnetization direction of the double free layer 180 is parallel to the lower pinned layer 151, and a resistance value of the magnetic tunnel junction may be increased when a magnetization direction of the double free layer 180 is anti-parallel to the lower pinned layer 151.

The double free layer 180 may be formed of, for example, a half-metallic full Heusler alloy, an amorphous rare earth element alloy, a multilayer thin film wherein a magnetic metal and non-magnetic metal are alternately laminated, or a ferromagnetic material such as an alloy having an L10-type crystal structure.

The double free layer 180 may be formed in a structure wherein the lower free layer 171, the separation layer 180 and the upper free layer 172 are laminated. Accordingly, the lower free layer 171 and the upper free layer 172 may be vertically separated from each other by the separation layer 180. The lower free layer 171 and the upper free layer 172 may have magnetization in the same direction or in different directions. For example, each of the lower free layer 171 and the upper free layer 172 may have perpendicular magnetization, or the lower free layer 171 may have perpendicular magnetization and the upper free layer 172 may have horizontal magnetization.

Accordingly, the memory device according to an embodiment of the present invention includes the double free layer 170, thereby exhibiting improved thermal stability compared to a single storage layer.

In addition, the separation layer 180 may be formed of a material with a BCC structure not having magnetization. Accordingly, the lower free layer 171 may be perpendicularly magnetized, the separation layer 180 may not be magnetized, and the upper free layer 172 may be perpendicularly or horizontally magnetized. Here, each of the lower free layer 171 and the upper free layer 172 may be formed of CoFeB, and the lower free layer 171 may be formed to the same or thinner thickness than the upper free layer 172. In addition, the separation layer 180 may be formed to a thinner thickness than the lower free layer 171 and the upper free layer 172. For example, the lower free layer 171 and the upper free layer 172 may be formed to a thickness of 0.5 nm to 1.5 nm using CoFeB, and the separation layer 180 may be formed to a thickness of 0.2 nm to 0.5 nm using a material having a BCC structure, e.g., W.

In addition, the lower free layer 171 may further include Fe to further increase perpendicular magnetization. Accordingly, the lower free layer 171 may be formed by laminating Fe and CoFeB. Here, Fe may be formed to a thinner thickness than CoFeB, for example to a thickness of 0.3 nm to 0.5 nm.

According to an embodiment, a second bridge layer 142 may be further included between the magnetic tunnel junction and the upper synthetic antiferromagnetic layer 190 of the memory device according to an embodiment of the present invention. The second bridge layer 142 may include the same configuration as the first bridge layer 141. The thickness of the second bridge layer 142 may be 0.3 nm to 0.5 nm.

The upper synthetic antiferromagnetic layer 190 is formed on the second bridge layer 142. A magnetization direction of the upper synthetic antiferromagnetic layer 190 may be changed.

The upper synthetic antiferromagnetic layer 190 includes a first magnetic layer 191, a non-magnetic layer 192 and a second magnetic layer 193. Accordingly, in the upper synthetic antiferromagnetic layer 190, the first magnetic layer 191 and the second magnetic layer 193 may be antiferromagnetically coupled with each other via the non-magnetic layer 192, and the first magnetic layer 191 and the second magnetic layer 193 may have crystals in the (111) direction of a face-centered cubic (FCC) or the (001) direction of a hexagonal close-packed (HCP) structure.

In addition, magnetization directions of the first and second magnetic layers 191 and 193 are arranged to be anti-parallel. For example, the first magnetic layer 191 may be magnetized in an upward direction (i.e., in the direction of the upper electrode 210), and the second magnetic layer 193 may be magnetized in a downward direction (i.e., in the direction of the substrate 100).

The first magnetic layer 191 and the second magnetic layer 193 may be formed in a structure wherein a magnetic metal and a non-magnetic metal are alternately laminated. As the magnetic metal, a single metal selected from the group consisting of iron (Fe), cobalt (Co), nickel (Ni) and the like or alloys thereof may be used. As the non-magnetic metal, a single metal selected from the group consisting of chromium (Cr), platinum (Pt), palladium (Pd), iridium (Ir), rhodium (Rh), ruthenium (Ru), osmium (Os), rhenium (Re), gold (Au) and copper (Cu) or alloys thereof may be used. For example, the first magnetic layer 191 and the second magnetic layer 193 may be formed of $[Co/Pd]_X$, $[Co/Pt]_X$ or $[CoFe/Pt]_X$ (where X is an integer greater than or equal to 1), preferably $[Co/Pt]_X$ ((where X is an integer greater than or equal to 1)).

The number of [Co/Pt] layers of the first magnetic layer 191 of the upper synthetic antiferromagnetic layer 190 of the memory device according to an embodiment of the present invention may be 3 to 6, and the number of [Co/Pt] layers of the second magnetic layer 132 may be 1 to 3. Accordingly, the first magnetic layer 191 may be formed thicker than the second magnetic layer 193.

For example, the first and second magnetic layers 131 and 133 may be formed to have the same thickness by laminating the same material a plurality of times. In this case, the number of times of lamination may be larger at the time of forming the first magnetic layer 131 as compared to at the time of forming the second magnetic layer 133. For example, the first magnetic layer 131 may be formed of $[Co/Pt]_6$, that is, may be formed by laminating Co and Pt six times, and the second magnetic layer 133 may be formed of $[Co/Pt]_3$, that is, may be formed by laminating Co and Pt three times. In this case, Co may be formed in a thickness of 0.3 nm to 0.5 nm. Pt may be formed thinner than Co, or may be formed in the same thickness as Co. For example, Pt may be formed in a thickness of 0.2 nm to 0.4 nm.

In addition, Co may be further formed on the repeatedly laminated [Co/Pt], i.e., $[Co/Pt]_6$, of the first magnetic layer 191. That is, the first magnetic layer 191 may have a structure wherein Co is laminated one more time than Pt. In this case, a Co layer located at the top may be formed thicker than Co layers located therebelow, and, for example, may be formed to have a thickness of 0.5 nm to 0.7 nm. In addition, Co and Pt may be further formed under $[Co/Pt]_3$ of the second magnetic layer 193, and Co may be further formed on the second magnetic layer 193. That is, Co, Pt, $[Co/Pt]_3$ and Co may be laminated on the non-magnetic layer 192, thereby forming the second magnetic layer 193. Here, Co under $[Co/Pt]_3$ has the same or thicker thickness than Co of $[Co/Pt]_3$. For example, Co under $[Co/Pt]_3$ may be formed to a thickness of 0.5 nm to 0.7 nm, Pt under $[Co/Pt]_3$ may be formed to the same thickness as Pt of $[Co/Pt]_3$, and Co on $[Co/Pt]_3$ may be formed to the same thickness as that of Co of $[Co/Pt]_3$.

The non-magnetic layer 192 is formed between the first magnetic layer 191 and the second magnetic layer 193, and is formed of a non-magnetic material to allow anti-magnetic coupling of the first magnetic layer 191 and the second magnetic layer 193. For example, the non-magnetic layer 192 may be formed of a single material selected from the group consisting of ruthenium (Ru), rhodium (Rh), osmium (Os), rhenium (Re) and chromium (Cr) or alloys thereof, preferably ruthenium (Ru).

According to an embodiment, a capping layer 200 may be further included between the upper synthetic antiferromagnetic layer 190 and the upper electrode 210 of the memory device according to an embodiment of the present invention.

The capping layer 200 is formed on the upper synthetic antiferromagnetic layer 190. The capping layer 200 is formed of a polycrystalline material, e.g., a conductive material having a body-centered cubic (BCC) structure. For example, the capping layer 200 may be formed of tungsten (W). When the capping layer 200 is formed of a polycrystalline material, the crystallinity of the magnetic tunnel junction may be improved.

Accordingly, when an amorphous magnetic tunnel junction is formed on a first bridge layer 141 having a body-centered cubic (BCC) structure, the amorphous magnetic tunnel junction grows in the crystal direction of the first bridge layer 141. In addition, when heat treatment is performed after forming the capping layer 200 having a body-centered cubic (BCC) structure on the magnetic tunnel junction, crystallinity of the magnetic tunnel junction may be further improved. In addition, the capping layer 200 serves to prevent diffusion of the upper electrode 210. The capping layer 200 may be formed to a thickness of, for example, 0.3 nm to 0.5 nm.

The upper electrode 210 is formed on the capping layer 200. The upper electrode 210 may be formed using a conductive material, e.g., metal, metal oxide, metal nitride, or the like. For example, the upper electrode 220 may be formed of a single metal selected from the group consisting of tantalum (Ta), ruthenium (Ru), titanium (Ti), palladium (Pd), platinum (Pt), magnesium (Mg) and aluminum (Al) or alloys thereof.

As described above, the memory device according to an embodiment of the present invention includes the lower pinned layer 151 and lower synthetic antiferromagnetic layer 130 in which magnetization is fixed; and the upper pinned layer 152 and upper synthetic antiferromagnetic layer 190 in which magnetization is changed, so that a resistance state increases in a magnetization direction of the upper pinned layer 152 and thus a multi-bit operation is allowed.

A multi-bit operation of the memory device according to an embodiment of the present invention is described with reference to FIGS. 4A to 4D.

FIGS. 4A to 4D are schematic diagrams illustrating parallel and anti-parallel states of a memory device according to an embodiment of the present invention.

In the case of the memory device according to an embodiment of the present invention, a magnetization direction of the lower pinned layer 151 is constantly fixed, whereas a magnetization direction of the upper pinned layer 152 is changed according to a specific magnetic field value. Accordingly, four resistance states may be maintained according to a magnetization direction of the upper pinned layer 152 and a magnetization direction of the double free layer 170, so that a multi-bit operation is possible and thus high integration may be easily realized.

More specifically, in the double free layer 170 and the upper pinned layer 152 of the memory device according to an embodiment of the present invention, perpendicular magnetic anisotropy and resistance may be exhibited in a range of −2 kOe to +2 kOe representing perpendicular magnetic properties.

For example, the memory device according to an embodiment of the present invention may have three high resistance states (AP1 state, AP2 state, AP3 state), as in FIGS. 4B to 4D, and four resistance states including one low resistance state (P state), as in FIG. 4A, according to magnetization directions of the upper pinned layer 152 and the double free layer 170 when an external magnetic field range is −2 kOe to +2 kOe.

Accordingly, the memory device according to an embodiment of the present invention includes a double pinned layer structure wherein the upper pinned layer 152 and the upper synthetic antiferromagnetic layer 190 are included on the free layer 170, thereby allowing realization of a high-capacity, high-integration memory device and thus high-speed rewriting.

FIG. 5A illustrates an embodiment of a lower pinned layer structure of a memory device according to an embodiment of the present invention.

The lower pinned layer structure of the memory device according to an embodiment of the present invention is designed such that a magnetization direction of a lower pinned layer is constantly maintained in the direction of a down-spin (or up-spin).

FIGS. 5B and 5C illustrate magnetic properties dependent upon a lamination ratio of second and first magnetic layers of a lower synthetic antiferromagnetic layer in a lower pinned layer structure of a memory device according to an embodiment of the present invention.

FIG. 5B illustrates a magnetization curve when second and first magnetic layers in a lower pinned layer structure have a [Co/Pt] layer number ratio of m:n=3:6 as in a memory device having a conventional structure; and a magnetization curve when the second and first magnetic layers of the lower synthetic antiferromagnetic layer in the lower pinned layer structure of the memory device according to an embodiment of the present invention have a [Co/Pt] layer number ratio of m:n=0:3.

Referring to FIGS. 5B and 5C, the perpendicular magnetic properties of the double free layer (information storage layer) of the memory device according to an embodiment of the present invention are almost the same in "a" regions (−500 Oe to 500 Oe) of FIGS. 5B and 5C, but are different in "b" regions (>2 kOe or <−2 kOe), in which the perpendicular magnetic properties of the lower pinned layer and the lower synthetic antiferromagnetic layer (lower SyAF layer) are exhibited, of FIGS. 5B and 5C.

Referring to FIG. 5B, it can be confirmed that, when a [Co/Pt] layer number ratio of the second and first magnetic layers is m:n=3:6, squareness representing perpendicular properties is exhibited and an exchange field (Hex) maintains about 2.64 kOe.

On the other hand, referring to FIG. 5C, it can be confirmed that, when a [Co/Pt] layer number ratio of the second and first magnetic layers is m:n=0:3, squareness is deteriorated, but an exchange field increases to about 3.44 kOe so as not to cause read disturbance. Accordingly, it can be confirmed that it may operate as a memory even when a [Co/Pt] layer number ratio of the second and first magnetic layers is reduced to m:n=0:3.

In addition, it can be confirmed that, in both the memory device according to an embodiment of the present invention wherein a [Co/Pt] layer number ratio of the second and first magnetic layers is m:n=3:6 and the memory device according to an embodiment of the present invention wherein a [Co/Pt] layer number ratio of the second and first magnetic layers is m:n=0:3, the magnetization directions of the lower pinned layer and the second magnetic layer (Bot Upper SyAF MLs) of the lower synthetic antiferromagnetic layer are reversed and thus down-spun when an external saturated magnetic field is reduced.

FIG. 6A illustrates an embodiment of a memory device having a conventional structure, and FIG. 6B illustrates an embodiment of the structure of an upper pinned layer of a memory device according to an embodiment of the present invention.

Referring to FIG. 6A, a single synthetic antiferromagnetic layer and pinned layer are included.

Referring to FIG. 6B, the upper pinned layer of the memory device according to an embodiment of the present invention is designed in an up-spin (down-spin) direction such that a magnetization direction of the upper pinned layer basically faces a direction opposite to a magnetization direction of the lower pinned layer.

In addition, the upper pinned layer of the memory device according to an embodiment of the present invention is designed such that the number of [Co/Pt] layers of the second magnetic layer (top upper SyAF MLs) of the upper synthetic antiferromagnetic layer is smaller than the number of [Co/Pt] layers of the first magnetic layer (top lower SyAF MLs) of the upper synthetic antiferromagnetic layer, and thus, the magnetization direction of the upper pinned layer is basically opposite to that of the lower pinned layer when an external saturated magnetic field is reduced to '0', in contrast to the lower pinned layer structure of the memory device according to an embodiment of the present invention.

FIGS. 6C and 6D illustrate magnetic properties dependent upon a lamination ratio of first and second magnetic layers of an upper synthetic antiferromagnetic layer in an upper pinned layer structure of a memory device according to an embodiment of the present invention.

Referring to FIG. 6C, it can be confirmed that, when a magnetic field range of the upper pinned layer is −15 kOe to 15 kOe and an external magnetic field is 0 Oe, a magnetization direction of the upper pinned layer is up-spun which is maintained until an external magnetic field reaches a certain value (about −200 Oe to −1 kOe) or more in an opposite direction (−).

On the other hand, to switch the magnetization direction of the upper pinned layer to down-spin, an external magnetic field above a certain value should be applied in (−) direction.

Accordingly, it can be confirmed that, since all structures of the memory devices according to an embodiment of the present invention exhibit the same tendency, the number of [Co/Pt] layers of the first magnetic layer (top lower SyAF MLs) of the upper synthetic antiferromagnetic layer may be 3 to 6, and the number of [Co/Pt] layers of the second magnetic layer (top upper SyAF MLs) of the upper synthetic antiferromagnetic layer may be 1 to 3.

FIG. 6D illustrates an enlarged view of "a" region of FIG. 6C.

Referring to FIG. 6D, it can be confirmed that the coercivity of a double free layer (information storage layer) having a conventional structure is Hc~0.4 kOe and is switched in (i) region, and a memory margin in the conventional structure is determined by the coercivity (i) of a double free layer (information storage layer) and a coercivity difference ((ii) region) between [Co/Pt]a or b of an upper synthetic antiferromagnetic layer.

When a [Co/Pt] layer number ratio of the first and second magnetic layers of the upper synthetic antiferromagnetic layer is a:b=1:3, switching occur in Hc~0.4 kOe that is the same as in the double free layer (information storage layer). Accordingly, there is no possibility of multi-bit. In addition, when a [Co/Pt] layer number ratio of the first and second magnetic layers of the upper synthetic antiferromagnetic layer is a:b=2:3, a coercivity is Hc~0.6 kOe. Accordingly, there is a possibility of multi-bit, but write errors occur due to a coercivity difference of only about 0.2 kOe.

However, it can be confirmed that, when a [Co/Pt] layer number ratio of the first and second magnetic layers of the upper synthetic antiferromagnetic layer is a:b=3:3, a coercivity is Hc~1.0 kOe and thus the largest memory margin is obtained, which is suitable for multi-bit.

In addition, it can be confirmed that, when a [Co/Pt] layer number ratio of the first and second magnetic layers of the upper synthetic antiferromagnetic layer is a:b=3:6, a coercivity is Hc~0.9 kOe and thus it is possible to obtain a memory margin, but there is no great difference from the case in which a [Co/Pt] layer number ratio of the first and second magnetic layers of the upper synthetic antiferromagnetic layer is a:b=3:3.

Accordingly, it can be confirmed that, when a ratio of the first magnetic layer (b) to the second magnetic layer (a) in the upper synthetic antiferromagnetic layer is (b≥a), there is a possibility of multi-bit in a conventional structure and a coercivity difference of 0.5 kOe or more is required for memory margin.

FIGS. 7A and 7B illustrate magnetic properties of a memory device including a single pinned layer.

FIG. 7A illustrates a magnetization curve of a memory device including a single pinned layer, and FIG. 7B illustrates an R-H curve of a memory device including a single pinned layer.

Referring to FIGS. 7A and 7B, it can be confirmed that, in a double free layer (information storage layer) region, which includes upper and lower free layers, of the memory device including a single pinned layer, perpendicular magnetic anisotropy and resistance are exhibited in a range of −500 Oe to +500 Oe representing perpendicular magnetic properties.

It can be confirmed that, in the case wherein a magnetization direction of a pinned layer of the memory device including a single pinned layer is fixed, and a magnetization direction of a double free layer (information storage layer) thereof is changeable, a low resistance state (parallel state) is realized when an external magnetic field range is −500 Oe to +100 Oe and magnetization directions of the pinned layer and the double free layer (information storage layer) are parallel, and a high resistance state (anti-parallel state) is realized when an external magnetic field is +500 Oe to −20 Oe and magnetization directions of the pinned layer and the double free layer (information storage layer) are anti-parallel.

Accordingly, it can be confirmed that only two resistance states including a low resistance state and a high resistance state are present in the memory device including a single pinned layer.

FIGS. 8A and 8B illustrate magnetic properties of a memory device according to an embodiment of the present invention.

FIG. 8A illustrates a magnetization curve of a memory device according to an embodiment of the present invention, and FIG. 8B illustrates an R-H curve of a memory device according to an embodiment of the present invention.

Referring to FIGS. 8A and 8B, it can be confirmed that, in the case of the memory device according to an embodiment of the present invention, an upper free layer (information storage layer), a double free layer (free layer region) including a separation layer and a lower free layer (information storage layer), and an upper pinned layer exhibit perpendicular magnetic anisotropy and resistance in a range of −2 kOe to +2 kOe representing perpendicular magnetic properties.

It can be confirmed that, in the case of the memory device according to an embodiment of the present invention including two pinned layers, four resistance states including three high resistance states (AP1, AP2, AP3) and one low resistance state (P state) are present according to magnetization directions of an upper pinned layer (top pinned layer) and a double free layer (information storage layer) when an external magnetic field range is −2 kOe to +2 kOe.

FIG. 8C illustrates tunnel magnetic resistance (TMR) ratios dependent upon anti-parallel states (AP1 to AP3) of a memory device according to an embodiment of the present invention.

A tunnel magnetoresistance (TMR) ratio is calculated according to the following Equation 1:

$$\text{Tunnel magnetoresistance (TMR) ratio} = (R_{AP} - R_P)/R_P \times 100 \quad [\text{Equation 1}]$$

In Equation 1, $R_{AP}$ represents a tunnel magnetoresistance value in an anti-parallel state, and $R_P$ represents a tunnel magnetoresistance value in a parallel state.

Referring to FIG. 8C, it can be confirmed that tunnel magnetoresistance (TMR) ratios of anti-parallel states (high resistance states; AP1 to AP3) with respect to a parallel state (low resistance state; P state) are respectively 152.6% (AP1-P state), 33.6% (AP2-P state) and 166.5% (AP3-P state).

Accordingly, referring to FIGS. 8A to 8C, it can be confirmed that a total of four resistance states including one parallel state and three anti-parallel states are present in the memory device according to an embodiment of the present invention.

FIG. 9 is a schematic block diagram illustrating an embodiment of a memory system including a memory device according to an embodiment of the present invention.

Referring to FIG. 9, a memory system 1100 may be applied to PDAs, portable computers, web tablets, wireless phones, mobile phones, digital music players, memory cards, or all devices that can transmit and/or receive information in wireless environments.

The memory system 1100 includes a controller 1110, input/output devices 1120 such as a keypad, a keyboard and a display, a memory 1130, an interface 1140, and a bus 1150. The memory 1130 and the interface 1140 communicate with each other through the bus 1150.

The controller 1110 includes at least one microprocessor, digital signal processor, or microcontroller, or other similar processors. The memory 1130 may be used to store instructions executed by a controller. The input/output device 1120 may receive data or signals from the outside of the memory system 1100 or may output data or signals to the outside of the memory system. For example, the input/output device 1120 may include a keyboard, a keypad or a display device.

The memory 1130 includes the memory device according to an embodiment of the present invention. The memory 1130 may further include other types of memory, volatile memory for random access, and various other types of memory.

The interface 1140 transmits data to a communication network or serves to receive data from the network.

FIG. 10 is a schematic block diagram illustrating an embodiment of a memory card provided with a memory device according to an embodiment of the present invention.

Referring to FIG. 10, a memory card 1200 for supporting high-capacity data storage capability is equipped with a memory device 1210 according to an embodiment of the present invention. The memory card 1200 according to the present invention includes a memory controller 1220 for controlling data exchange between a host and the memory device 1210 according to an embodiment of the present invention.

An SRAM 1221 is used as an operation memory of a central processor unit 1222. A host interface 1223 includes a data exchange protocol of a host connected to the memory card 1200. An error correction block 1224 detects and corrects errors included in date that is read from the memory device 1210 according to an embodiment of the present invention. The memory interface 1225 interfaces with the memory device 1210 according to an embodiment of the present invention. The central processor unit 1222 performs various control operations for date exchange of the memory controller 1220. Although not shown in drawings, the memory card 1200 according to an embodiment of the present invention may further include ROM (not shown) for storing code date for interfacing with a host, which is obvious to those of ordinary skill in the art.

FIG. 11 is a schematic block diagram illustrating an embodiment of an information processing system equipped with a memory device according to an embodiment of the present invention.

Referring to FIG. 11, a memory system 1310 according to an embodiment of the present invention is mounted in an information processing system such as a mobile device or a desktop computer. An information processing system 1300 according to the present invention includes a modem 1320, CPU 1330, a RAM 1340, and user interface 1350 respectively, electrically connected to the memory system 1310 according to an embodiment of the present invention via a bus 1360. The memory system 1310 according to an embodiment of the present invention may include a memory controller 1312 and the memory device 1311 according to an embodiment of the present invention. Data processed by the CPU 1330 or data input from the outside are stored in the memory system 1310 according to an embodiment of the present invention.

Here, the memory system 1310 according to an embodiment of the present invention may be configured as a semiconductor disk device (SSD). In this case, the information processing system 1300 may stably store a large amount of data in the memory system 1310 according to an embodiment of the present invention. In addition, the memory system 1310 according to an embodiment of the present invention can reduce resources required for error correction due to increased reliability, and thus, can provide a high-speed data exchange function to the information processing system 1300. Although not shown, the information processing system 1300 according to the present invention may further include an application chipset, a camera image processor (CIS), an input/output device, and the like, which is obvious to those of ordinary skill in the art.

In addition, the memory device or memory system according to an embodiment of the present invention may be mounted in various packages forms. For example, the memory device or memory system according to an embodiment of the present invention may be packaged and mounted in manners such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Meanwhile, embodiments of the present invention disclosed in the present specification and drawings are only provided to aid in understanding of the present invention and the present invention is not limited to the embodiments. It will be apparent to those skilled in the art that various modifications can be made to the above-described exemplary embodiments of the present invention without departing from the spirit and scope of the invention.

The invention claimed is:

1. A memory device, comprising:
a substrate; and
a lower electrode, a seed layer, a lower synthetic an antiferromagnetic layer, a magnetic tunnel junction, an upper synthetic antiferromagnetic layer, and an upper electrode that are laminated on the substrate,
wherein the magnetic tunnel junction comprises a lower pinned layer, a lower tunnel barrier layer, a lower free layer, a separation layer, an upper free layer, an upper tunnel barrier layer and an upper pinned layer that are sequentially laminated.

2. The memory device according to claim 1, wherein a magnetization direction of the lower pinned layer is fixed, and a magnetization direction of the upper pinned layer is changeable.

3. The memory device according to claim 1, wherein a magnetization direction of the lower synthetic antiferromagnetic layer is fixed, and a magnetization direction of the upper synthetic antiferromagnetic layer is changeable.

4. The memory device according to claim 1, wherein the upper and lower synthetic antiferromagnetic layers are formed in a structure wherein a first magnetic layer, a non-magnetic layer and a second magnetic layer are laminated, the first and second magnetic layers comprising [Co/Pt].

5. The memory device according to claim 4, wherein the number of [Co/Pt] layers of the first magnetic layer of the lower synthetic antiferromagnetic layer is 3 to 6, and the number of [Co/Pt] layers of the second magnetic layer is 0 to 3.

6. The memory device according to claim 4, wherein the number of [Co/Pt] layers of the first magnetic layer of the upper synthetic antiferromagnetic layer is 3 to 6, and the number of [Co/Pt] layers of the second magnetic layer is 1 to 3.

7. The memory device according to claim 1, wherein the lower electrode has a structure wherein a first lower electrode comprising tungsten and a second lower electrode comprising TiN are laminated.

8. The memory device according to claim 1, wherein a bridge layer is further comprised between the lower synthetic antiferromagnetic layer and the magnetic tunnel junction and between the magnetic tunnel junction and the upper synthetic antiferromagnetic layer.

9. The memory device according to claim 8, wherein the bridge layer has a thickness of 0.3 nm to 0.5 nm.

10. The memory device according to claim 1, wherein a capping layer is further comprised between the upper synthetic antiferromagnetic layer and the upper electrode.

11. The memory device according to claim 10, wherein the capping layer has a thickness of 0.3 nm to 0.5 nm.

* * * * *